(12) United States Patent
Blanc et al.

(10) Patent No.: US 7,986,011 B2
(45) Date of Patent: Jul. 26, 2011

(54) ELECTROSTATIC DISCHARGE PROTECTION DEVICE

(75) Inventors: Fabrice Blanc, Zurich (CH); Frederic Francois Barbier, Vimont (FR)

(73) Assignee: NXP B.V., Eindhoven (NL)

(*) Notice: Subject to any disclaimer, the term of this patent is extended or adjusted under 35 U.S.C. 154(b) by 255 days.

(21) Appl. No.: 12/088,731

(22) PCT Filed: Oct. 5, 2006

(86) PCT No.: PCT/IB2006/053640
§ 371 (c)(1),
(2), (4) Date: Mar. 31, 2008

(87) PCT Pub. No.: WO2007/039880
PCT Pub. Date: Apr. 12, 2007

(65) Prior Publication Data
US 2008/0224220 A1 Sep. 18, 2008

(30) Foreign Application Priority Data
Oct. 6, 2005 (EP) .................................... 05109282

(51) Int. Cl.
*H01L 23/62* (2006.01)
(52) U.S. Cl. ........ 257/357; 257/360; 257/361; 257/362; 257/370
(58) Field of Classification Search .................. 257/335, 257/357, E29.062, 173, 345, 355, 360, 370, 257/371
See application file for complete search history.

(56) References Cited

U.S. PATENT DOCUMENTS

| | | | | |
|---|---|---|---|---|
| 5,021,852 A * | 6/1991 | Sukegawa et al. | ............ | 257/378 |
| 5,281,841 A * | 1/1994 | Van Roozendaal et al. | .. | 257/360 |
| 5,504,362 A | 4/1996 | Pelella et al. | | |
| 5,571,738 A * | 11/1996 | Krivokapic | .................... | 438/291 |
| 5,663,082 A | 9/1997 | Lee | | |
| 5,814,869 A * | 9/1998 | Dennen | ......................... | 257/408 |
| 5,891,792 A * | 4/1999 | Shih et al. | ...................... | 438/525 |
| 5,903,029 A * | 5/1999 | Hayashida et al. | ........... | 257/344 |
| 6,171,891 B1 * | 1/2001 | Lee et al. | ........................ | 438/197 |
| 6,265,251 B1 * | 7/2001 | Jun et al. | ........................ | 438/183 |
| 6,426,535 B1 * | 7/2002 | Takeuchi et al. | ............... | 257/408 |
| 6,528,850 B1 * | 3/2003 | Hebert | .......................... | 257/345 |
| 6,627,955 B2 * | 9/2003 | Salling et al. | ................. | 257/355 |
| 6,670,678 B2 * | 12/2003 | Kojima | .......................... | 257/355 |
| 6,768,173 B2 * | 7/2004 | Hebert | .......................... | 257/345 |
| 6,867,103 B1 | 3/2005 | Yu | | |
| 6,882,009 B2 * | 4/2005 | Ker et al. | ....................... | 257/349 |
| 7,355,252 B2 * | 4/2008 | Kim et al. | ..................... | 257/360 |
| 2003/0164521 A1 | 9/2003 | Kojima | | |
| 2003/0205765 A1 * | 11/2003 | Masuoka | ....................... | 257/369 |
| 2004/0043568 A1 * | 3/2004 | Ker et al. | ...................... | 438/279 |
| 2005/0045954 A1 | 3/2005 | Kao | | |
| 2007/0241407 A1 * | 10/2007 | Kim et al. | ..................... | 257/371 |

* cited by examiner

*Primary Examiner* — Kenneth Parker
*Assistant Examiner* — David Spalla

(57) ABSTRACT

The invention provides an electrostatic discharge (ESD) protection device with an increased capability to discharge ESD generated current with a reduced device area. The ESD protection device comprises a grounded gate MOS transistor (1) with a source region (3) and a drain region (4) of a first semiconductor type interposed by a first well region (7) of a second semiconductor type. Second well regions (6) of the first semiconductor type, interposed by the first well region (7), are provided beneath the source region (3) and the drain region (4). Heavily doped buried regions (8,9) of the same semiconductor types, respectively, as the adjoining well regions (6,7) are provided beneath the well regions (6,7).

8 Claims, 2 Drawing Sheets

ELECTROSTATIC DISCHARGE PROTECTION DEVICE

This invention relates to an electrostatic discharge (ESD) protection device.

With advances in the development of high density very large scale integration (VLSI) circuits, the dimensions of the devices continue to shrink resulting in a corresponding decrease of gate oxide thickness and junction depth in CMOS (Complementary Metal Oxide Semiconductor) devices. This trend has resulted in a greater susceptibility to damage arising from the application of excessive voltages such as those caused by an ESD event. During an ESD event, charge is transferred between one or more pins or external electrodes of integrated circuits and another conducting object in a short period of time, typically less than one microsecond. The charge transfer generates voltages large enough to break down insulating films, such as gate oxides in MOSFET (MOS Field Effect Transistor) devices, and is capable to dissipate sufficient energy to cause electrothermal failures in the devices. Such failures include contact spiking, silicon melting, or metal interconnect melting. Consequently, in order to deal with transient ESD pulses, an integrated circuit preferably should incorporate a protection circuit at every pin.

Offset transistors are commonly used as clamping devices in ESD protection structures in CMOS and BiCMOS (Bipolar CMOS) technologies. Such offset transistors may be grounded gate n-channel MOS transistors (ggNMOSTs) or gate coupled n-channel MOS transistors (gcNMOSTs). Compared to regular NMOSTs (with an n-type lightly doped drain), former devices have been shown to be more robust and effective in protecting internal transistors against ESD events.

All MOST devices show a so-called snapback behavior during ESD events. Snapback means that a part of a MOST switches from MOS action to bipolar action, which enables the MOST to conduct large currents at a lower holding voltage. FIG. 1 shows a schematic diagram of an NMOS offset transistor. Gate, source, drain and substrate electrodes are indicated by G, S, D and B respectively. In view of the fact that in this case a p-doped substrate is used, a lateral NPN-structure is formed, which results in a parasitic bipolar transistor configuration PT indicated by the dotted transistor symbol. The base electrode of the parasitic bipolar transistor PT is connected via a symbolic substrate resistor RS to a substrate or base electrode B.

FIG. 2 shows a typical I-V characteristic of a ggNMOST, i.e. an NMOST as shown in FIG. 1 with gate, source and substrate grounded at 0V. When an ESD event occurs, comprising a positive voltage pulse from drain with respect to ground, the drain voltage rises until it reaches Vt1, at which voltage the n-type drain to p-type substrate junction undergoes avalanche or first breakdown. The holes, created by impact ionization, will drift towards a substrate contact increasing the substrate potential until the source-substrate junction is sufficiently forward-biased to begin bipolar action between drain and source. As a result snapback occurs in the parasitic lateral bipolar NPN transistor and the drain voltage drops to a snapback holding voltage Vsp. As current increases further, thermal or second breakdown occurs at a voltage Vt2 marking the onset of permanent damage in the form of increased leakage. It is therefore important that an ESD protection device, such as the ggNMOST, is able to sink as much of the current, which is triggered by the ESD event, as possible to prevent that the thermal or second breakdown occurs.

One solution for increasing the current sink capability of an ESD protection device is to include a resistance ballast in the drain region which enables a more homogeneous discharge or sink of the ESD generated current thereby reducing local heating effects which can be detrimental for the ESD protection device.

US 2005/0045954 discloses a method for manufacturing an ESD protection device, comprising a ggMOST. The thus manufactured ggMOST comprises a polysilicon gate structure, and a source and a drain region formed in a p-well region. A salicide layer is formed on the surfaces of the polysilicon gate structure, the source region and the drain region. Furthermore a heavy-doped extended blocking region is formed enclosing the drain region, extending laterally into the p-type well region and vertically below the drain region. The extended blocking region serves as a resistance ballast for the ESD current between the drain contact and the polysilicon gate. Because the resistance ballast is beneath the drain and hence deeper in the p-well region than the drain region itself, the ESD current can be discharged in a more homogeneous way thereby increasing capability to sink or discharge the ESD generated current. However, there is still a relatively large area required to allow a homogenous ESD current flow, because a too small area for the resistance ballast will induce local heating near the drain region and hence cause damage to the ESD device.

It is an object of the invention to provide an ESD device with an increased capability to discharge ESD generated current with a reduced device area. According to the invention, this object is achieved by providing an electrostatic discharge protection device as claimed in claim 1.

The ESD device according to the invention is provided in a semiconductor substrate of a second semiconductor type and comprises a gate region, which extends over a first well region of the second semiconductor type. The first well region is interposed between a source region and a drain region both of a first semiconductor type. Furthermore the ESD device comprises a second well region of the first semiconductor type under the source region and under the drain region, while the first well region is being interposed between the second well region under the source region and the second well region under the drain region. Further, a first buried region of the first semiconductor type is provided under the first well region, and a second buried region of the second semiconductor type is provided under the second well regions. The first and the second buried region have a higher doping level than the first and the second well region enabling the avalanche or first breakdown to occur between the first and second buried regions. The ESD protection device according to the invention has a reduced device area, because there is no resistance ballast that extends laterally into the first well region. The ESD generated current will flow down into the first and second buried regions, because these regions are more heavily doped than the first and second well regions. This way a low resistance current path is provided from the drain region down to the buried regions thereby providing a vertical resistance ballast that extends from the drain region through the second well region to the second buried region enabling the ESD protection device to sink more ESD current.

In a preferred embodiment of the ESD protection device according to the invention, the ESD protection device is electrically isolated from other devices by a first isolation region. This way the isolation of the ESD protection device is determined by the breakdown voltage of the junction between the first or second buried region and the semiconductor substrate and not by the breakdown voltage of the junction between the second buried region of the ESD protection device and the first buried region of another neighboring device, the latter breakdown voltage being lower than the former breakdown voltage because of the relatively high doping level of the first and second buried regions.

In another embodiment of the ESD protection device according to the invention, the first isolation region comprises a deep trench isolation region. The deep trench isolation region extends into the semiconductor substrate below the first and second buried regions such that the second buried region of the ESD protection device is separated, and hence electrically isolated, from the first buried region of another neighboring device by the deep trench isolation region.

In another embodiment of the ESD protection device according to the invention, the ESD protection device further comprises a substrate contact region electrically connecting to the semiconductor substrate, the substrate contact region being electrically isolated from the source and drain region by a second isolation region. The substrate contact region serves to electrically contact the semiconductor substrate. To prevent a break down of the source or drain region to the substrate contact region during an ESD event, the substrate contact region is electrically isolated from the source and drain region.

In a preferred embodiment of the ESD protection device according to the invention, the substrate contact region, the source region and the gate region are mutually electrically connected. This way the ESD protection device advantageously comprises a grounded gate MOS transistor.

These and other aspects of the invention will be further elucidated and described with reference to the drawings, in which.

The Figures are not drawn to scale. In general, identical components are denoted by the same reference numerals in the Figures.

Figure 1:
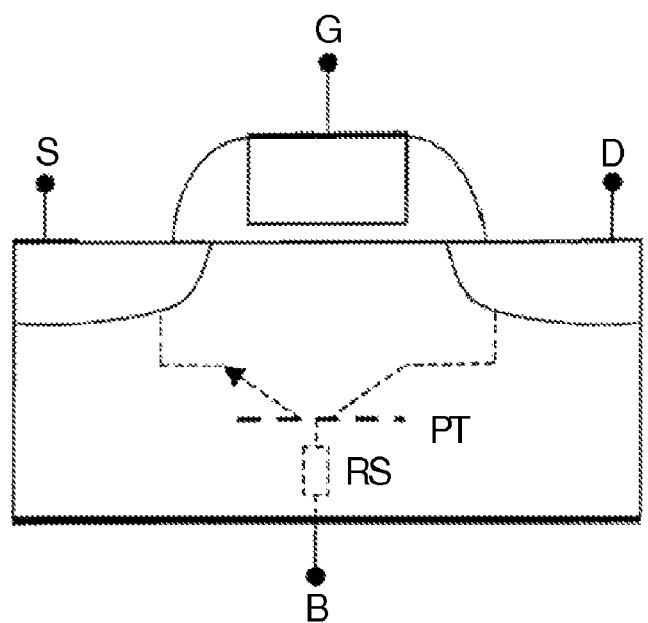
FIG. 1 shows a schematic diagram of a NMOS offset transistor used in ESD protection circuits.
Figure 2:
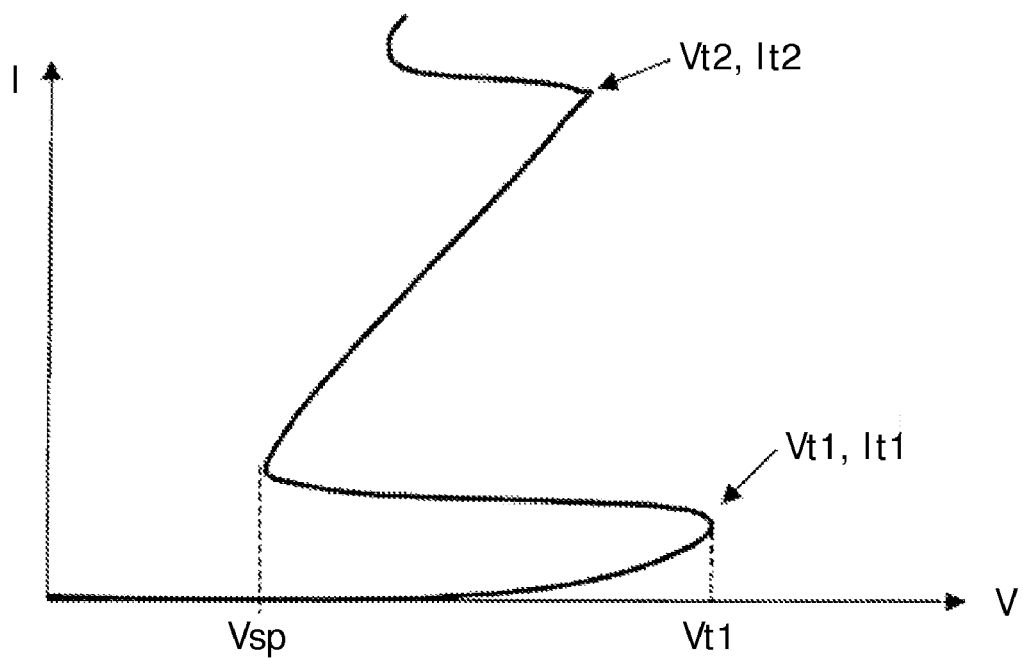
FIG. 2 shows a diagram indicating a typical I-V characteristic of an NMOS offset transistor as shown in FIG. 1, with gate, source and substrate grounded at 0V (ggNMOST)
Figure 3:
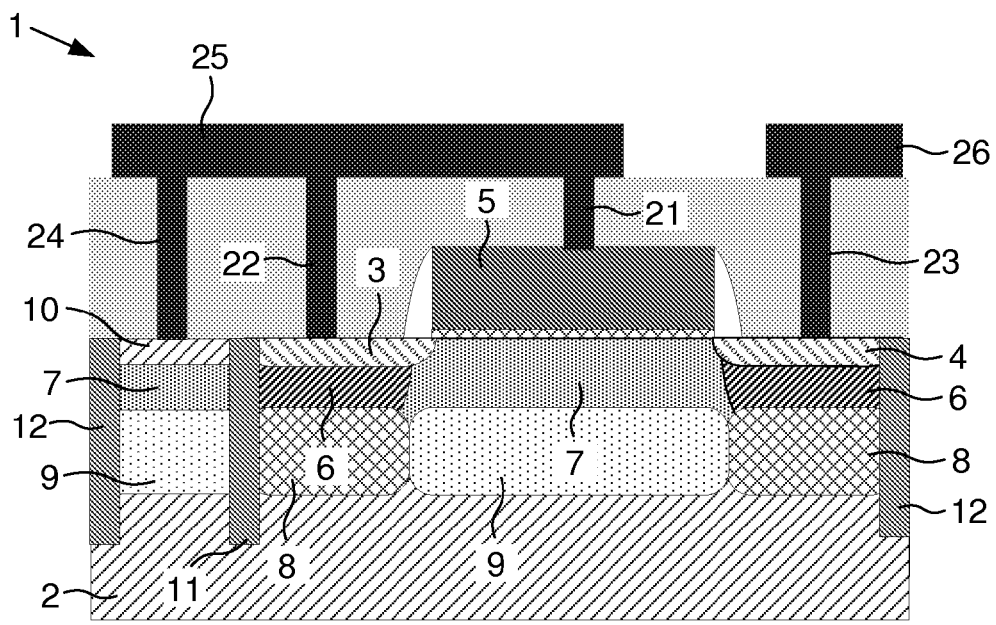
FIG. 3 shows a cross-sectional view of an embodiment of the ESD protection device according to the invention.

FIG. 3 illustrates a cross-sectional view of an embodiment of an ESD protection device according to the invention formed in a p-type substrate region 2 and comprising, in this example, a ggNMOS transistor 1. The ggNMOS transistor 1 comprises an n-type source region 3, an n-type drain region 4 and a gate electrode 5. Beneath the source region 3 and beneath the drain region 4, an n-type well region 6 is formed. A p-type well region 7 is interposed in between the source region 3 and the drain region 4 and in between the n-type well regions 6 beneath the source and drain regions 3, 4. N-type buried regions 8 are formed beneath the n-type well regions 6, and a p-type buried region 9 is formed beneath the p-type well region 7. The ESD protection device further comprises a p-type contact region 10 that electrically connects to the substrate region 2 via the p-type well region 7 and the p-type buried region 9. The contact region 10 is in this example electrically isolated from the ggNMOS transistor 1 via a deep trench isolation region 11, however another type of isolation, such as a shallow trench isolation may also be applied. The ESD protection device is electrically isolated from neighboring devices by the deep trench isolation regions 12, thereby electrically isolating the p-type buried region 9 and the n-type buried region 8 of the ggNMOS transistor 1 from the p-type buried region 9 and the n-type buried region 8 of other neighboring devices that adjoin the deep trench isolation regions 12. The drain region 4 is electrically contacted via a drain contact 23 to a first conductive layer 26, for example a metal like aluminum or copper, to be able to apply a voltage to the drain region 4. The gate region 5, the source region 3 and the contact region 10 are electrically connected to a second conductive layer 25, for example a metal like aluminum or copper, via a gate contact 21, a source contact 22 and a substrate contact 24 respectively. In normal operation the second conductive layer 25 is connected to a ground voltage.

Figure 4:
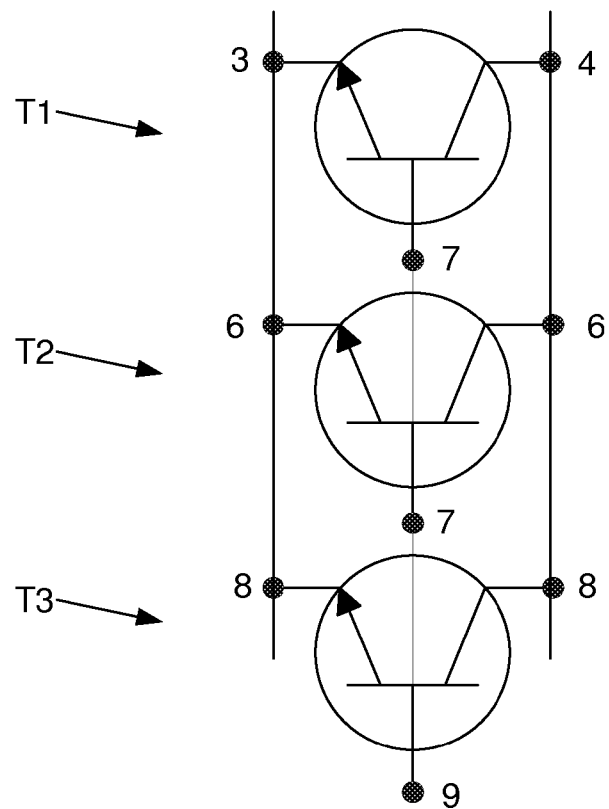
FIG. 4 shows a schematic circuit arrangement of the ESD protection device according to the invention.

As is shown in FIG. 4, the ESD protection device 1 comprises three parallel parasitic bipolar lateral NPN transistors, T1, T2 and T3, in which emitter, base and collector each have common connections. The base of the bipolar transistor T1 comprises the p-type well region 7, the emitter or collector comprises the n-type source region 3 and the collector or emitter comprises the n-type drain region 4. The base of the bipolar transistor T2 comprises the p-type well region 7, the emitter and the collector comprise the n-type well regions 6. The base of the bipolar transistor T3 comprises the p-type buried region 9, the emitter and the collector comprise the n-type buried regions 8.

In the case of an ESD event, a positive voltage pulse is applied on the drain region 4 with respect to the ground voltage, which is applied to the gate region 5, the source region 3 and the substrate contact region 10. The voltage on the n-type drain region 4, which is also present on the n-type well region 6 and the n-type buried region 8, rises until the junction with the lowest breakdown voltage undergoes avalanche or first breakdown, which in this case is the junction between the n-type buried region 8 and the p-type buried region 9. The holes, created by impact ionization, will drift towards the p-type buried region 9 thereby increasing the voltage of the p-type buried region 9 until the junctions between the p-type buried region 9 and the n-type buried region 8 are sufficiently forward-biased to begin the bipolar action of the NPN transistors T3. As a result snapback occurs in the parasitic lateral bipolar NPN transistor T3 and the voltage on the n-type buried region 8 beneath the drain region 4 drops to a snapback holding voltage. The ESD current will flow mainly via the bipolar transistor T3 thereby creating a large vertical resistance ballast extending from the n-type drain region 4 through the n-type well region 6 to the n-type buried region 8 which prevents local heating to occur near the drain region 4 which can cause damage to the ESD protection device 1. Local heating is also reduced by the relatively large conduction path that is available between the buried regions which increases the power dissipation capability for a high current density with respect to the conduction path that is available in the prior art at the surface of the drain region. After the activation of T3 the bipolar transistors T1 and T2 may similarly be activated via the vertical resistance ballast. In this way the current carrying capability of the ESD protection device 1 is increased thereby enabling the ESD protection device 1 to sink a larger ESD current. Examples of breakdown voltages are 9V for the junction between the p-type buried region 9 to n-type buried region 8, 14V for the junction between the drain region 4 to p-type well region 7 and 85V for the junction between the n-type buried region 8 to p-type substrate region 2.

The ESD protection device 1 is preferably manufactured in a BiCMOS technology in which the buried regions 8, 9 are available because these are required for the standard bipolar transistors. However, the ESD protection device 1 can also be incorporated in a CMOS technology by using the deep n-type layer, used for manufacturing an isolated NMOSt, as a buried region.

The trigger voltage during an ESD event may be set to a required value by optimizing the breakdown voltage of the junction between the p-type buried region 9 and the n-type buried region 8. This breakdown voltage depends, amongst others, on the amount of overlap of the p-type buried region 9 and the n-type buried region 8 which may be set to a specific value by setting the distance between these regions in the lay-out of the design. In this case, the p-type buried region 9 and the n-type buried region 8 are designed with a specific distance and hence do not adjoin. However, after an implant and an anneal step the p-type buried region 9 and the n-type buried region 8 do adjoin and will have an amount of overlap which depends on the initial distance between these regions in the original lay-out of the design.

In summary, the invention provides an ESD protection device with an increased capability to discharge ESD generated current with a reduced device area. The ESD protection device comprises a grounded gate MOS transistor with a source region and a drain region of a first semiconductor type interposed by a first well region of a second semiconductor type. Second well regions of the first semiconductor type, interposed by the first well region, are provided beneath the source region and the drain region. Heavily doped buried regions of the same semiconductor types, respectively, as the adjoining well regions are provided beneath the well regions.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. An electrostatic discharge protection device provided in a semiconductor substrate of a second semiconductor type, the electrostatic discharge protection device comprising:
    a source region and a drain region of a first semiconductor type,
    a gate region extending over a first well region of the second semiconductor type, the first well region being provided in between the source region and the drain region,
    a second well region of the first semiconductor type under the source region and under the drain region, the first well region being provided in between the second well region under the source region and the second well region under the drain region,
    a first buried region of the second semiconductor type under the first well region,
    a second buried region of the first semiconductor type under the second well region,
    wherein the first and the second buried regions have a higher doping level than the first and the second well regions; and
    the electrostatic discharge protection device further comprising
    three parallel parasitic bipolar lateral transistors, a first one of the transistors having a base formed by the first well region, having an emitter formed by one of the source and drain regions and having a collector formed by the other one of the source and drain regions, a second one of the transistors having a base formed by the first well region, having an emitter formed by a first part of the second well region and having a collector formed by a second part of the second well region, and a third one of the transistors having a base formed by the first buried region, having an emitter formed by a first part of the second buried region and having a collector formed by a second part of the second buried region.

2. The electrostatic discharge device as claimed in claim 1, wherein the first transistor has a higher breakdown voltage than the second transistor and the second transistor has a higher breakdown voltage than the third transistor.

3. The electrostatic discharge device as claimed in claim 1, wherein the second buried region includes a first part and a second part that are separate from each other by part of the first buried region, the first part of the second buried region located under the second well under the source region and the second part of the second buried region located under the second well under the drain region.

4. The electrostatic discharge device as claimed in claim 1, further comprising a substrate contact region of the second semiconductor type, the substrate contact region being electrically isolated from the source region by an isolation region and the substrate contact electrically connected to the semiconductor substrate via a part of the first well region that is electrically isolated from the second well region by the isolation region and via a part of the first buried region that is electrically isolated from the second buried region by the isolation region.

5. An electrostatic discharge protection device provided in a semiconductor substrate doped with a first semiconductor type that is one of N doping and P doping, the electrostatic discharge protection device comprising:
    a vertical stack of transistors including
        a first transistor that includes
            a first source region of a second semiconductor type that is the other of N doping and P doping;
            a first drain region of the second semiconductor type; and
            a first gate region of the first semiconductor type;
        a second transistor below the first transistor and that includes
            a second source region of the second semiconductor type and more heavily doped than the first source region;
            a second drain region of the second semiconductor type and more heavily doped than the first drain region; and
            a second gate region of the first semiconductor type; and
        a third transistor below the second transistor and that includes
            a third source region of the second semiconductor type and more heavily doped than the second source region;
            a third drain region of the second semiconductor type and more heavily doped than the second drain region; and
            a third gate region of the first semiconductor type and more heavily doped than the second gate region.

6. The device of claim 5, wherein the third transistor has a conduction path between the third drain and the third source that is larger than a conduction path between the first drain and the first source.

7. The device of claim 5, wherein the first and second gate regions have the same doping levels.

8. The device of claim 5, wherein a breakdown voltage between the third gate region and the third drain region is around 9 volts, a breakdown voltage between the second gate region and the second drain region is around 14 volts and a breakdown voltage between the first gate region and the first drain region is around 45 volts.

* * * * *